atent Number: 4,839,558
Date of Patent: Jun. 13, 1989

United States Patent [19]
Mierzwinski

[54] INTEGRATED DC ELECTROLUMINESCENT DISPLAY SYSTEM

[75] Inventor: Eugene P. Mierzwinski, Fort Wayne, Ind.

[73] Assignee: Hamilton Standard Controls, Inc., Farmington, Conn.

[21] Appl. No.: 197,194

[22] Filed: May 23, 1988

[51] Int. Cl.⁴ .................... H05B 33/14; H05B 33/22; G09G 3/30
[52] U.S. Cl. .................... 313/510; 313/498; 313/506; 313/512; 340/719; 340/825.1
[58] Field of Search ............ 313/498, 500, 502, 503, 313/505, 506, 509, 510, 511, 512; 340/825.81, 718, 719

[56] References Cited

U.S. PATENT DOCUMENTS 3,786,307  1/1974  Robinson .................... 315/169 TV
3,803,437  4/1974  Robinson .................... 313/108 R
4,159,559  7/1979  Robinson, Sr. .............. 29/25.14
4,646,074  2/1987  Hashimoto .................. 340/718

OTHER PUBLICATIONS

Phosphor Products Company Limited, "2000 Character DC Electroluminescent Display", Preliminary Specification, Jun. 1984.

Primary Examiner—Kenneth Wieder

[57] ABSTRACT

An integrated electroluminescent display (DCEL), in which the DCEL (11) is integrted into the substrate board (10), such as, for example, a printed circuit board, which carries associated electronic components (12), such as, for example, those which would make up a control circuit, the DCEL displaying pertinent information for the control circuit. The bottom electrode (13) for the DCEL can be copper foil, which is etched at the same time as the rest of the foil pattern (13A) used to electrically interconnect the control components (12) of the overall control circuit during the making of the printed circuit board. Thereafter, the phosphor layer (14) is printed onto the associated copper foil segments, and, finally, a glass (15), which has on its inner surface an appropriate pattern of tin oxide (16), is placed on top of the phosphor depositions. The glass is then adhesively bonded to the printed circuit board and appropriate connections made between the tin oxide and the printed circuit board connectors with conductive adhesives, and a sealant (17) is applied around the edge of the glass to prevent moisture from entering the phosphor. Moisture traps (18) can be deposited before the glass is applied to surround each phosphor deposition. The P.C. board is thus made an integral, substrate part of the DCEL.

9 Claims, 2 Drawing Sheets

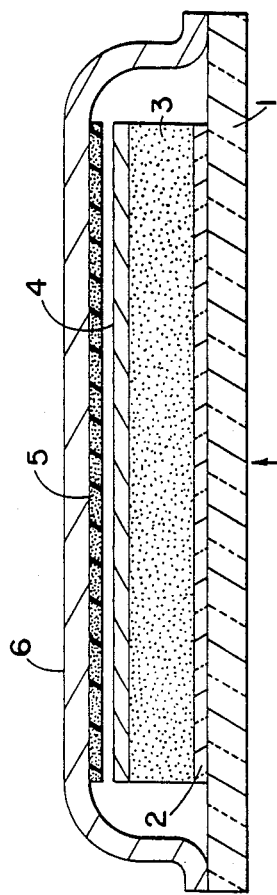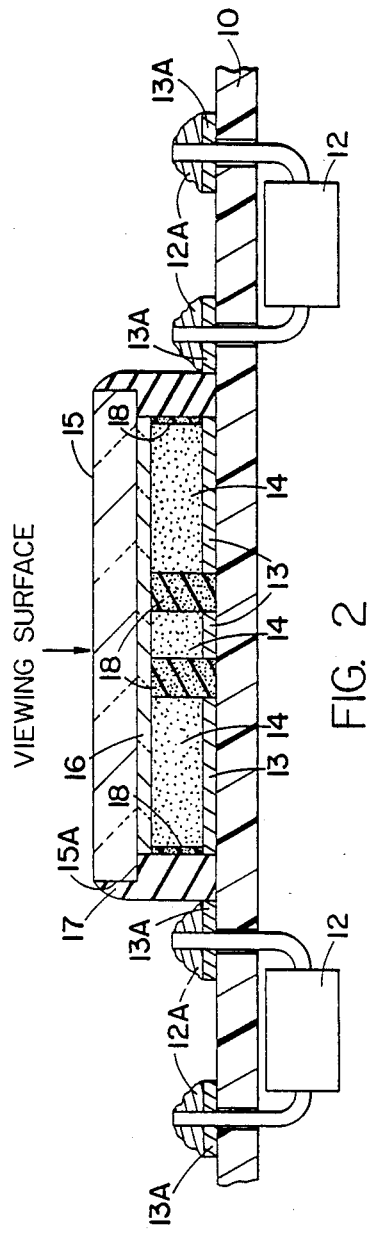

INTEGRATED DC ELECTROLUMINESCENT DISPLAY SYSTEM

DESCRIPTION

1. Technical Field

The present invention relates to electroluminescent displays, and more particularly to variable electroluminescent displays which are electrically or electronically controlled, and even more particularly to methods of making such displays.

2. Background Art

Many control systems require changing displays to indicate status, set points, time, messages, and other information which is necessary for proper operation and process control.

Most of the displays that are currently used for this purpose are vacuum fluorescent displays which offer great economy. In addition to economy, as compared to other display techniques, the vacuum fluorescent display has gained wide market acceptance.

However, in spite of its economy, the display is either the most expensive or one of the most expensive components in a control system, with the display comprising for example, 15 to 25% of the total material cost, often exceeding the cost of the microprocessor used in such control systems.

A display technology exists which can be used to achieve greater economies in the display technology, this display technology being known as electroluminescent display (DCEL). This technology, generally speaking, has been around since approximately the mid-1940's. Its primary application until a few years ago has been predominantly as back illumination or panel illumination, used, for example, in airplane cockpits.

Within the last few years, advances in this technology, particularly in phosphor materials and drive techniques have made it possible to use the electroluminescent approach for the display of intelligent information. Indeed, displays of high resolution, as well as simple segmented digital formats, are used in automotive, telephone switching gear, computer graphic terminals, typewriter displays, etc.

Typically, in the prior art, the DCEL display is constructed as a separate display component, with the component connected to appropriate electronic circuits by a connector for operation. An exemplary prior art construction is illustrated in FIG. 1.

As shown in FIG. 1, the DCEL display of the prior art typically includes a glass substrate 1 (plain ordinary window glass will do), which is coated with a transparent layer 2 of tin oxide. The tin oxide 2 is appropriately etched to form electrodes for the display.

On top of the tin oxide electrode 2, a layer 3 of phosphor is applied. On top of the phosphor 3, a second electrode 4 of, for example, aluminum, is formed either by screen printing, vapor deposition, or other techniques.

Moisture traps 6 are provided to absorb and hold any moisture which may be present within the structure of the DCEL. A metal cover 6 completes the assembly.

To make the display operational, it needs to be polarized. This is done by applying a high voltage (e.g. 80-100 volts) for a period of time between the two electrodes. This causes migration of the phosphor molecules, so as to form a junction with the tin oxide/phosphor interface 3. This migration also establishes the polarity of voltage required for display operations.

Although most of today's DCEL displays emit a yellow/orange light, other phosphors can be used to provide other display colors. In addition to the foregoing exemplary prior art structure, other variants have been suggested.

Electroluminescent displays have been presented in various forms. One patentee has been Thomas L. Robinson, who has received U.S. Pat. Nos. 3,786,307 (issued Jan. 15, 1974), 3,803,437 (issued April 9, 1974) and 4,159,559 (issued July 3, 1979). For example, in the '307 patent the electroluminescent display panel is mounted on a printed circuit board as a separable element and in the preferred embodiment is secured to the circuit board by means of screws having offset spaces between the display panel and the printed circuit board. The display panel includes as part of its integrated structure its electrode strips. Thus, although the panel is mounted on the printed circuit board, it is included as a separate, separable element which is self-contained independently of the printed circuit board. Indeed, one of the stated advantages of the design of the '307 patent, stated to be one of its "main advantages," is that the electroluminescent portion can be a separate detachable part of the display assembly by making the bottom electrode part of another assembly. In the '307 patent the bottom electrode part includes a plurality of spaced, parallel metal strips or conductors secured on the upper face of the printed circuit board.

For further general background information reference is made to the past DCEL products made by Phosphor Products Co., Ltd., for example its "2000 Character DC Electroluminescent Display," a copy of its preliminary specification sheet dated June, 1984, being filed with this application.

DISCLOSURE OF THE INVENTION

In contrast to the prior art, the present invention integrates the electroluminescent display into the overall electronic circuitry, for example, the control circuitry, with the substrate for the display being a board which supports or carries the electronic circuitry, for example, a printed circuit board, or alternatively ceramics, insulated metals, or molded PC boards, etc.

Thus, the present invention constructs the DCEL display on, for example, the printed circuit board substrate, that is the same substrate to which all the other control or other electrical components are placed and are carried and supported.

This can be achieved, for example, by providing the segment pattern for the DCEL display to be etched on the copper foil along with the rest of the foil pattern that is used for interconnecting the control or other electrical components. On top of the etched copper segment patterns is printed the phosphor layer. Finally, a glass, which has on its inner surface a pattern of tin oxide is placed on top of the phosphor depositions, with the glass being adhesively bonded to the printed circuit board with appropriate connections being made between the tin oxide and the printed circuit board connectors with conductive adhesives. A RTV (room temperature vulcanizing) seal or some other suitable material is applied around the edge of the glass to prevent moisture from entering the phosphor.

In essence, the construction of the present invention is the reverse of what is typically done in constructing DCEL panels in the prior art.

Thus, the present invention includes a process which includes, for example, depositing phosphor compound and other display components unto a printed wiring or circuit board or other like substrate that also contains and carries other electronic components, so that the display becomes an integral part of the electronic assembly substrate.

For example, the deposition of the phosphor is accomplished by printing of the phosphor in a desirable pattern unto conductor targets on the printed wiring board. These conductors in turn connect with appropriate drive components, which also are on the same printed wiring board.

Additionally, the present invention can include the deposition of moisture traps in such a fashion as to surround each phosphor deposition.

Likewise, the present invention includes having a layer of a transparent conductor deposited unto the glass, which in turn is adhesively bonded to the printed wiring board, with the conductively-coated surface of the glass being in direct contact with the deposited phosphor.

The conductive coating of the glass is then connected to additional conductors on the printed wiring board, preferably with conductive adhesives.

Finally, the edges of the display boundary are preferably further sealed against moisture and other contaminants.

The present invention thus provides a most cost effective construction of, for example, control systems having an integrated DCEL display.

The foregoing and other features and advantages of the present invention will become more apparent from the following further description and drawings.

BRIEF DESCRIPTION OF DRAWINGS

FIG. 1 is a side, simplified, cross-sectional view of an exemplary DCEL display constructed in accordance with typical prior art principles.

FIG. 2 is a side, cross-sectional view of an exemplary, preferred embodiment of the integrated DCEL display of the present invention, with the display integrated into the exemplary printed circuit board carrying the other associated control circuit electronic components.

BEST MODE FOR CARRYING OUT THE INVENTION

Figure 3:
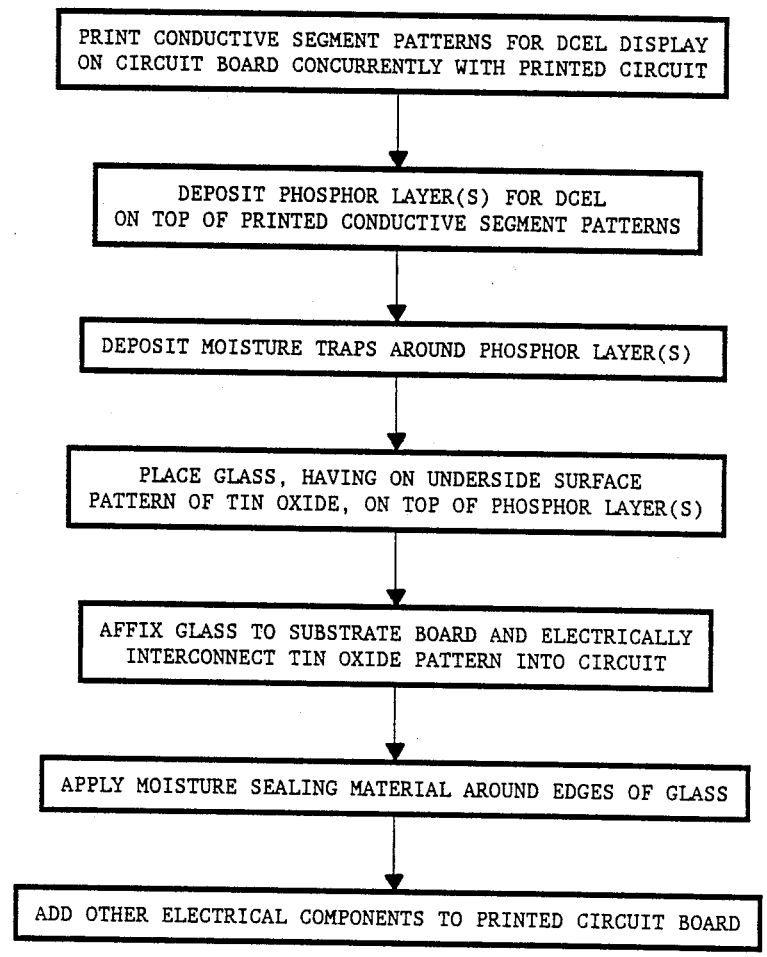
FIG. 3 is a simplified, flow chart outlining the basic manufacturing steps followed in the preferred methodology of the present invention.

As indicated above, in contrast to the prior art approach of constructing the DCEL as a separate component, such as that illustrated in FIG. 1 and with reference to FIG. 2, the present invention integrates the electroluminescent display 11 into the overall electronic circuitry, for example, the control circuitry, with the substrate 10 for the display also being the substrate or board which supports or carries the electronic circuitry and components 12 for the control circuitry, such as, for example, resistors, capacitors, transistors, etc, including drivers for the display 11, as part of the control circuitry, which cause the DCEL to display intelligent images. An exemplary driver for the display 11 would be a "Sprague" Part No. UCN 5810A. The other components 12 can be pin mounted with soldered junctions 12A, as shown, or can be surface mounted, if so desired, or otherwise provided on the substrate board 10.

Thus, the present invention constructs the DCEL display 11 on, for example, the printed circuit board substrate 10, that is on the same substrate to which all the other control or other electrical components 12 are placed and are carried and supported.

This is achieved, for example, in the preferred, exemplary method of the present invention by providing the segment pattern 13 for the DCEL display 11 to be etched on the copper foil, along with the rest of the foil pattern 13A that is used for electrically interconnecting the control or other electrical components to form the printed control circuitry. As is known, the etched conductive layers 13 & 13A are very thin and by themselves would be insufficient in their inherent structural strength to be used as a separate or separable element and indeed rely on the substrate 10 for the structural rigidity to hold their form. These layers 13A are typically formed by photographic "printing" techniques, using various screening, etching and plating processes, as is well known in the art.

On top of the etched copper segment patterns 13 is "printed" or otherwise suitable deposed the adjacent phosphor layers 14.

Finally, a glass element 15, typically rectangular in shape and which has on its inner surface a deposited pattern of tin oxide 16, is placed on top of the phosphor depositions 14, with the glass 15 being adhesively bonded to the printed circuit board 10. The glass 15 forms the viewing surface for the DCEL. The transparent, conductively-coated, tin oxide surface 16 of the glass 15 is in direct, electrically conductive contact with the deposited phosphor layers 14, and the appropriate electrical connections are made between the tin oxide 16 and the printed circuit board connectors, preferably with conductive adhesives.

A RTV (room temperature vulcanizing) seal 17 or some other suitable material is applied around the edges 15A of the glass 15 to prevent moisture from entering the phosphor layers 14. Additionally, the present invention can include the deposition of moisture traps 18, in such a fashion as to surround each phosphor deposition layer 14.

Thus, in essence, the construction of the present invention, as summarized in the flow diagram of FIG. 3, is the reverse of what is typically done in constructing DCEL panels in the prior art.

As noted above, the substrate preferably is, for example, a printed circuit board 10. Alternatively, in place of the standard P.C. board as the substrate, ceramics, insulated metals, or molded PC boards, etc., could be used.

Although this invention has been shown and described with respect to a detailed, exemplary embodiment thereof, it should be understood by those skilled in the art that various changes in form, detail, methodology and/or approach may be made without departing from the spirit and scope of this invention.

Having thus described at least one exemplary embodiment of the invention, that which is claimed as new and desired to be secured by Letters Patent is claimed below:

1. An electroluminescent display (DCEL) system, including a printed circuit substrate, comprising:
   an electronic assembly substrate having printed circuit means thereon for electrically interconnecting other electrical components in addition to the DCEL;
   DCEL printed conductive segment patterns on said substrate having at least the same general physical characteristics as said printed circuit means, having been made on said substrate concurrently with said printed circuit means;

DCEL phosphor layer(s) on top of the etched conductive segment patterns; and a glass element having on its inner surface a DCEL pattern of tin oxide positioned over the phosphor depositions, said glass element being affixed to said substrate and said pattern of tin oxide being electrically interconnected into said printed circuit means; the DCEL being an integral part of the electronic assembly substrate, and the substrate being an integral part of the DCEL.

2. The electroluminescent display (DCEL) system of claim 1, wherein there is further included:

a moisture sealing material around the edge of said glass element preventing exterior moisture from entering said phosphor layer(s).

3. The electroluminescent display (DCEL) system of claim 1, wherein there is further included:

a series of moisture traps surrounding each phosphor layer absorbing any moisture within the DCEL.

4. The electroluminescent display (DCEL) system of claim 1, wherein there is further included:

a number of electrical components mounted on and carried by said substrate, said electrical components being electrically interconnected by said printed circuit means.

5. The electroluminescent display (DCEL) system of claim 1, wherein said electrical components, said printed circuit means and the DCEL form a control circuit.

6. An electroluminescent display (DCEL) control circuit system, including a printed circuit substrate, comprising:

an electronic assembly substrate having printed circuit means thereon for electrically interconnecting other electrical components in addition to the DCEL;

DCEL printed conductive segment patterns on said substrate having at least the same general physical characteristics as said printed circuit means, having been made on said substrate concurrently with said printed circuit means;

DCEL phosphor layer(s) on top of the etched conductive segment patterns;

a glass element having on its inner surface a DCEL pattern of tin oxide positioned over the phosphor depositions, said glass element being affixed to said substrate and said pattern of tin oxide being electrically interconnected into said printed circuit means; the DCEL being an integral part of the electronic assembly substrate, and the substrate being an integral part of the DCEL; and a number of electrical components mounted on and carried by said substrate, said electrical components being electrically interconnected by said printed circuit means together and to the DCEL, forming a control circuit.

7. The electroluminescent display (DCEL) system of claim 6, wherein there is further included:

a moisture sealing material around the edge of said glass element preventing exterior moisture from entering said phosphor layer(s).

8. The electroluminescent display (DCEL) system of claim 6, wherein there is further included:

a series of moisture traps surrounding each phosphor layer absorbing any moisture within the DCEL.

9. The electroluminescent display (DCEL) system of claim 6, wherein said electrical components include:

drive component means electrically connected to the DCEL for driving the DCEL, causing it to display intelligent images.

* * * * *